(12) United States Patent
Moore et al.

(10) Patent No.: US 11,757,017 B2
(45) Date of Patent: Sep. 12, 2023

(54) ANTI-PARALLEL DIODE FORMED USING DAMAGED CRYSTAL STRUCTURE IN A VERTICAL POWER DEVICE

(71) Applicant: Pakal Technologies, Inc., San Francisco, CA (US)

(72) Inventors: Paul M Moore, Hillsboro, OR (US); Vladimir Rodov, Seattle, WA (US); Richard A Blanchard, Los Altos, CA (US)

(73) Assignee: PAKAL TECHNOLOGIES, INC, San Francisco, CA (US)

( * ) Notice: Subject to any disclaimer, the term of this patent is extended or adjusted under 35 U.S.C. 154(b) by 0 days.

(21) Appl. No.: 17/725,037

(22) Filed: Apr. 20, 2022

(65) Prior Publication Data
US 2022/0344493 A1    Oct. 27, 2022

Related U.S. Application Data

(60) Provisional application No. 63/178,252, filed on Apr. 22, 2021.

(51) Int. Cl.
*H01L 29/66* (2006.01)
*H01L 29/745* (2006.01)
*H01L 21/265* (2006.01)

(52) U.S. Cl.
CPC .... *H01L 29/66363* (2013.01); *H01L 21/2652* (2013.01); *H01L 29/7455* (2013.01)

(58) Field of Classification Search
None
See application file for complete search history.

(56) References Cited

U.S. PATENT DOCUMENTS

| | | | | |
|---|---|---|---|---|
| 2010/0308370 | A1* | 12/2010 | Hshieh | H01L 29/0619 257/E27.022 |
| 2015/0364584 | A1* | 12/2015 | Ryu | H01L 29/7395 438/138 |
| 2018/0331185 | A1* | 11/2018 | Mori | H01L 29/7825 |
| 2021/0057556 | A1* | 2/2021 | Yilmaz | H01L 29/7397 |

\* cited by examiner

*Primary Examiner* — Khaja Ahmad
(74) *Attorney, Agent, or Firm* — Patent Law Group; Brian Ogonowsky

(57) ABSTRACT

After the various regions of a vertical power device are formed in or on the top surface of an n-type wafer, the wafer is thinned, such as by grinding. A drift layer may be n-type, and various n-type regions and p-type regions in the top surface contact a top metal electrode. A blanket dopant implant through the bottom surface of the thinned wafer is performed to form an n− buffer layer and a bottom p+ emitter layer. Energetic particles are injected through the bottom surface to intentionally damage the crystalline structure. A wet etch is performed, which etches the damaged crystal at a much greater rate, so some areas of the n− buffer layer are exposed. The bottom surface is metallized. The areas where the metal contacts the n− buffer layer form cathodes of an anti-parallel diode for conducting reverse voltages, such as voltage spikes from inductive loads.

17 Claims, 8 Drawing Sheets

74 — Laser anneal to activate implanted dopants

76 — Inject energetic particles to damage bottom of silicon in areas where want antiparallel diode 78 — Wet each bottom. Etch rate is increased in damaged areas.

ANTI-PARALLEL DIODE FORMED USING DAMAGED CRYSTAL STRUCTURE IN A VERTICAL POWER DEVICE

CROSS-REFERENCE TO RELATED APPLICATIONS

This application is based on provisional application Ser. No. 63/178,252, filed Apr. 22, 2021, by Paul M. Moore et al., assigned to the present assignee and incorporated herein by reference.

FIELD OF THE INVENTION

This invention relates to forming an anti-parallel diode in vertical power devices and, in particular, to using a damaged crystal structure to unevenly etch a bottom surface of the power device to form a cathode of the anti-parallel diode.

BACKGROUND

In a vertical power switch, let's assume that the power switch is coupled to a forward voltage, where its top metal electrode (a cathode) is coupled to a negative voltage, such as coupled to a load having its other terminal connected to ground, and its bottom metal electrode (an anode) coupled to a positive voltage. When the power switch is turned on, such as when its gate is positively biased, current flows between the two electrodes. When the power switch is off, at least one internal pn junction blocks the current flow.

The protect the power switch from a reverse voltage applied between the electrodes, such as a large "negative" voltage spike from an inductive motor load, it is known to provide an anti-parallel diode across the electrodes. This anti-parallel diode may be connected externally or may be an integral part of the power switch.

To better describe the context of the present invention, various types of vertical power switches will be described.

FIG. 1 illustrates a vertical power switch without an integral anti-parallel diode.

Applicant's U.S. Pat. No. 11,114,552, incorporated herein by reference, discloses a vertical insulated gate turn-off (IGTO) device which will be used as an example of one of many types of vertical power switch devices that can benefit from the present invention. The IGTO device from U.S. Pat. No. 11,114,552 will be described in detail, and the invention will later be described as a modification to such a device and related power devices.

Prior art FIG. 1 is a cross-sectional view of a small portion of a vertical IGTO device 10 described in U.S. Pat. No. 11,114,552. A full understanding of the structure of FIG. 1 is not essential to understanding the present invention, since the present invention primarily concerns the bottom layers of the device. FIG. 1 just shows an edge portion of the cellular IGTO device 10, and the structure contains a central active cellular array surrounded by a termination area.

A plurality of cells are shown having vertical gates 12 (e.g., doped polysilicon) formed in insulated trenches. A 2-dimensional array of the cells, forming a rectangular mesh or strips, may be formed in a common, lightly-doped p-well 14, and the cells are connected in parallel.

N+ regions 18 surround the gates 12 and are contacted by a top, metal cathode electrode 20. The n+ regions 18 may be formed by implantation or by other known dopant introduction methods. At various areas 16, an n+ region 18 is opened to cause the cathode electrode 20 to "weakly" short the various n+ regions 18 to the p-well 14. Such shorting weakly biases the p-well 14 to allow the n+ regions 18 to be at the cathode voltage while there is a voltage drop across the p-well 14 when current flows through the p-well 14. Such a voltage drop, if sufficiently high, forward biases the npn transistor's base-emitter junction to turn on the IGTO device 10.

The vertical gates 12 are insulated from the p-well 14 by an oxide layer 22. The gates 12 are connected together outside the plane of the drawing and are coupled to a gate voltage via a metal gate electrode 25 directly contacting the polysilicon portion 28. A patterned dielectric layer 26 insulates the gate electrode 25 from the p-well 14 and insulates the gates 12 from the cathode electrode 20. The guard rings 29 at the edge of the cell, and at the edge of the die, reduce field crowding for increasing the breakdown voltage.

A vertical npnp semiconductor layered structure is formed. There is a bipolar pnp transistor formed by a p+ substrate 30, an epitaxially grown n− drift layer 32, and the p-well 14. There is also a bipolar npn transistor formed by the n+ regions 18, the p-well 14, and the n− drift layer 32. An n-type buffer layer 35, with a dopant concentration higher than that of the n− drift layer 32, reduces the injection of holes into the n− drift layer 32 from the p+ substrate 30 when the device is conducting. A bottom anode electrode 36 contacts the substrate 30, and a top cathode electrode 20 contacts the n+ regions 18 and contacts the p-well 14 at selected locations. The p-well 14 surrounds the gate structure, and the n− drift layer 32 extends to the top surface around the p-well 14.

When the anode electrode 36 is forward biased with respect to the cathode electrode 20, but without a sufficiently positive gate bias, there is no current flow, since there is a reverse biased vertical pn junction and the product of the betas (gains) of the pnp and npn transistors is less than one (i.e., there is no regeneration activity).

When the gate 12 is sufficiently biased with a positive voltage (relative to the n+ regions 18), such as 2-5 volts, an inversion layer is formed around the gate 12, and electrons from the n+ regions 18 become the majority carriers along the gate sidewalls and below the bottom of the trenches in the inversion layer, causing the effective width of the npn base (the portion of the p-well 14 between the n-layers) to be reduced. As a result, the beta of the npn transistor increases to cause the product of the betas to exceed one. This condition results in "breakover," when holes are injected into the lightly doped n− drift layer 32 and electrons are injected into the p-well 14 to fully turn on the device. Accordingly, the gate bias initiates the turn-on, and the full turn-on (due to regenerative action) occurs when there is current flow through the npn transistor as well as current flow through the pnp transistor.

When the gate bias is taken to zero, such as the gate electrode 25 being shorted to the cathode electrode 20, or taken negative, the IGTO device 10 turns off, since the effective base width of the npn transistor is increased.

The device 10 is intended to be used as a high voltage, high current switch with low voltage drop. The maximum voltage for proper operation is specified in a data sheet for the device 10.

The n− drift layer 32 is thick and has an inherent high resistivity. The n− drift layer 32 depletes during the off state, such as to withstand a potential differential of over 500 volts, and conducts during the on state when holes are injected into the n− drift layer 32 from the p+ substrate 30 (acting as an emitter).

If protection by an anti-parallel diode is desired, an external one is connected across the electrodes.

FIG. 2 is another IGTO, described in Applicant's U.S. Pat. No. 8,569,117, incorporated herein by reference. The operation is very similar to that of FIG. 1, except that an anti-parallel diode is formed in the IGTO in its termination area that surrounds the active cell array. The anti-parallel diode acts as a free-wheeling diode. An n++ cathode region 40 is formed at the bottom of the silicon to act as a cathode of the anti-parallel diode. Any p-type region connected to the top metal electrode then acts as an anode of the anti-parallel diode to conduct a reverse current. Below the center cell array (left side) is formed a p++ anode region 44, so the central area does not contain the anti-parallel diode.

The anti-parallel diode design of FIG. 2 requires masking the back side of the wafer near the end of the fabrication process, after the wafer is thinned by grinding, followed by p-type and n-type doping steps, then laser annealing and drive-in steps. These processes are difficult to perform since there is a need to protect the front of the wafer, and the drive-in step affects all the regions in the device.

FIG. 3 is provided simply to illustrate an IGBT (insulated gate bipolar transistor) power switch, where the trenched gates 48 extend below the p-well 50 (unlike in FIGS. 1 and 2), so an n-channel is formed between the upper n+ source regions 52 and the n− drift region 54 when the gates are positively biased to create a current flow path between a top metal electrode 56 and a bottom metal electrode 58.

The present invention applies to any vertical power switch, such as FIGS. 1 and 3, that can benefit from an integral anti-parallel diode.

What is needed is technique for forming an anti-parallel diode in a vertical power switch without having to mask the back side of the wafer near the end of the fabrication process, followed by p-type and n-type doping steps, then laser annealing and driving-in steps.

SUMMARY

In one embodiment, the present invention entails modifications to the Applicant's previous IGTO devices, and related vertical power devices (e.g., IGBTs), to provide an integral anti-parallel diode.

After the various regions of the power device are formed in or on the top surface of a substrate wafer, the wafer is thinned (to lower resistivity and reduce forward voltage drop), such as by grinding. Let's assume the drift layer is n-type. All conductivity types may be reversed for an opposite polarity device.

Next, a blanket phosphorus (n-type) implant through the bottom surface of the thinned wafer is performed to form an n− buffer layer abutting the n− drift layer.

Next, a blanket boron (p-type) implant through the bottom surface of the wafer is performed to form a bottom p+ emitter layer abutting the n− buffer layer.

A laser anneal is then performed to activate the implanted dopants and recrystallize the silicon.

Next, energetic particles are injected through the bottom surface, such as $BF_2$, He, Ar, Ne, Si, Ge, or H atoms, to intentionally damage the crystalline structure. This may be a masked process or a blanket implant process. Other ways of damaging the bottom surface of the wafer can also be used. It is known that a damaged crystalline silicon structure etches much faster than a crystalline silicon structure in a wet etch bath, such as KOH (potassium hydroxide) or TMAH (tetramethyl ammonium hydroxide). Dosage and energy is such that the damage occurs in random locations and depths on the back surface, where there may be little or no damage in some areas but deep damage in other areas. If masking is used, the damage can be confined to a termination area or distributed. Simulation may be used to determine the suitable dosage and energy of the energetic particles.

Next, the bottom of the wafer is subjected to a wet etch, where the etchant inherently etches the damaged crystal at a much greater rate than the undamaged crystal. This is a non-masked process. The etch rate of the damaged crystal may be 20-200 times faster than the etch rate of the undamaged crystal. As a result, there will be areas of the p+ emitter layer that have not been etched through and other areas of the p+ emitter layer that have been completely etched through so that at least the n− buffer layer is exposed.

Next, an optional step of implanting n-dopant atoms, such as arsenic or phosphorus, in the exposed bottom surface may be performed. This step is used to form a subsequent low resistance ohmic contact to the exposed n-buffer region (or to the exposed n-buffer and n-drift regions) so an anti-parallel diode with low resistance n-type and p-type contact regions may be formed. In order for the bottom p+ layer to remain p+, the bottom layer must be heavily doped p-type so the net doping is still p+.

Next, the bottom surface is metallized to cover all the exposed regions of the bottom surface. Therefore, the metal will directly contact both the p+ emitter layer and the n− buffer layer. If the damage was extensive in some areas, the n drift layer would also have been exposed.

The areas where the metal contacts the n− buffer layer (or n− drift layer) form cathodes of an anti-parallel diode for conducting reverse voltages, such as voltage spikes from inductive loads due to switching. It is preferred that only a small portion of the metal electrode area contacts the n− buffer layer or n− drift layer so that there is still good coverage of the p+ emitter layer for efficient carrier injection into the drift layer and good current spreading when the device is on.

In another embodiment, after the implantation to form the n− buffer layer and p+ emitter layer, there is only a brief laser anneal so the crystal is still somewhat damaged. In such an embodiment, there is then no need to inject energetic particles to further damage the silicon crystal structure for the wet etch step.

Thus, the process for forming the anti-parallel diode does not require a mask for implanting n and p-type dopants. It is also optional to use a mask when injecting the energetic particles or for other steps.

Other techniques are described.

BRIEF DESCRIPTION OF THE DRAWINGS

Elements that are the same or equivalent are labeled with the same numbers.

DETAILED DESCRIPTION

Figure 4:
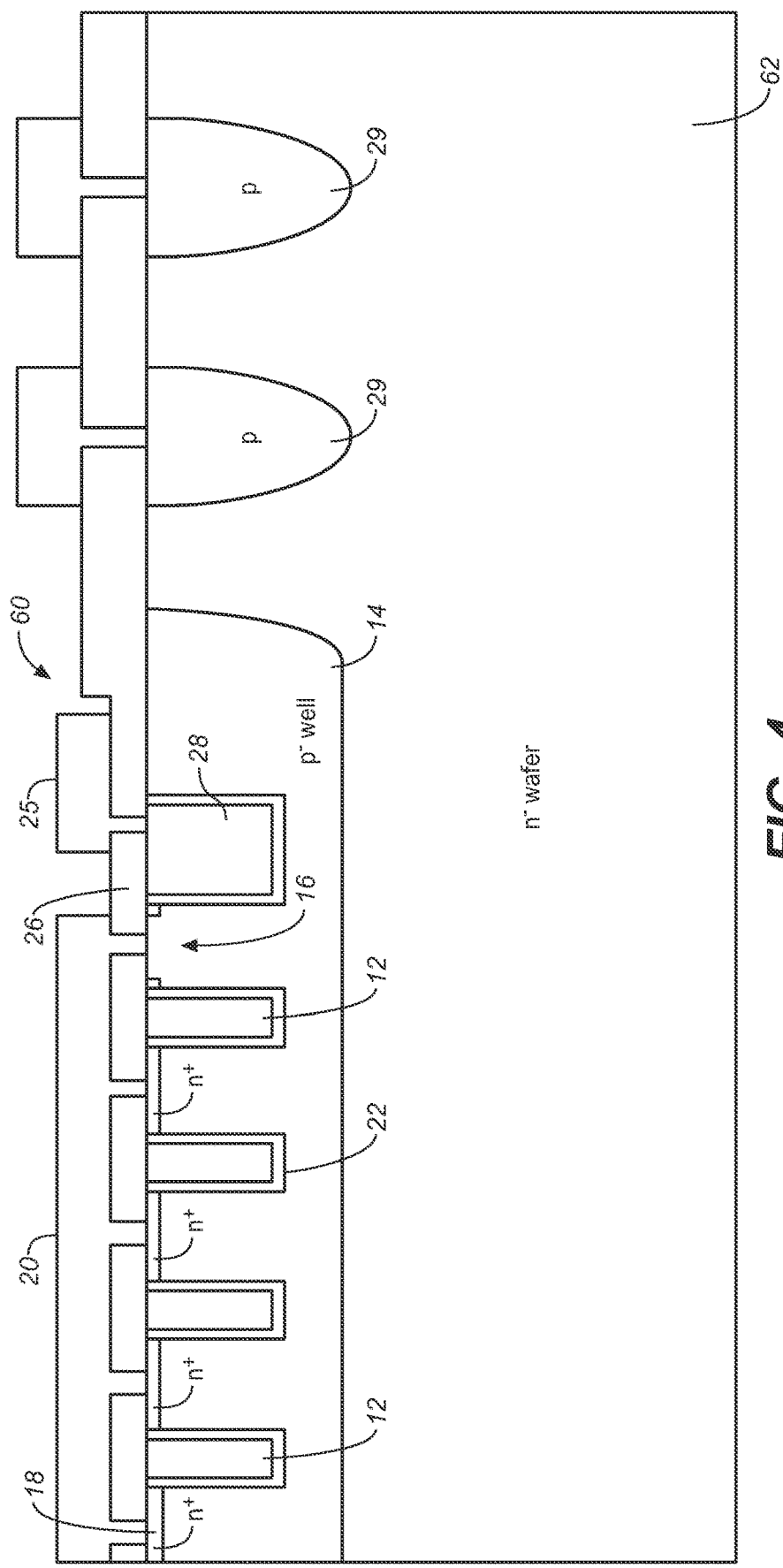
FIG. 4 illustrates an IGTO device prior to the back side of the wafer being ground down, in accordance with one embodiment of the invention.

FIG. 4 illustrates an IGTO device 60 prior to the back side of the n-type wafer 62 being ground down, in accordance with one embodiment of the invention. In one embodiment, the starting wafer 62 is n-type and is used for the drift region. In another embodiment, the wafer has a thick n-epitaxial layer formed over it that serves as the drift region. The wafer 62 may be up to 1000 microns thick at this stage.

Figure 5:
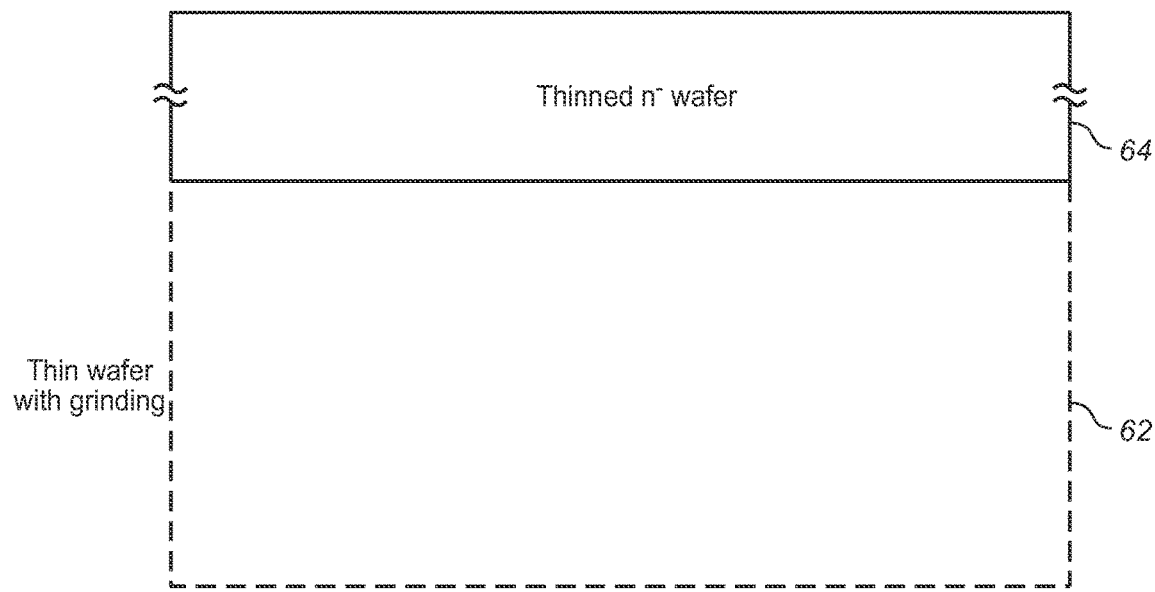
FIG. 5 illustrates the thinning of the wafer in FIG. 4, where details of the top device structure are not shown for simplicity.

FIG. 5 illustrates the thinning of the wafer 62 down to, for example, 50 microns, by grinding. Details of the top device structure are not shown for simplicity. The thinned wafer 64 is then subjected to backside processing. In another embodiment, the central area of the wafer 62 is thinned, and the perimeter is not thinned, using the well-known Taiko process.

Figure 6:
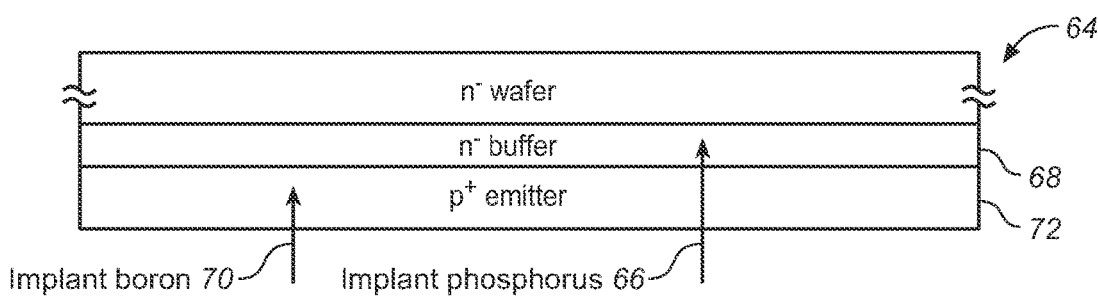
FIG. 6 illustrates blanket implantation of phosphorus and boron ions to form the n− buffer layer and bottom p+ emitter layer.

FIG. 6 illustrates blanket implantation of phosphorus ions 66 to form an n– buffer layer 68 and a blanket implantation of boron ions 70 to form the bottom p+ emitter layer 72. The phosphorus ions 66 have a higher energy than the boron ions 70 to be implanted deeper. The n– buffer layer 68 is optional. The n– buffer layer 68 is more highly doped than the overlying n– drift layer and helps control the injection of holes by the p+ emitter layer 72. The n– buffer layer 68 also limits the thickness of the depletion region when the device is off.

Figure 7:
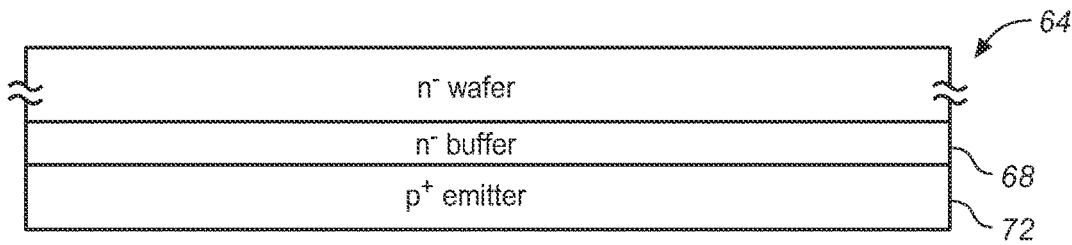
FIG. 7 illustrates a laser anneal step for activating the dopants and re-crystallizing the silicon.

FIG. 7 illustrates a laser anneal 74 of the back surface of the wafer 64 for activating the dopants and re-crystallizing the silicon.

Figure 8:
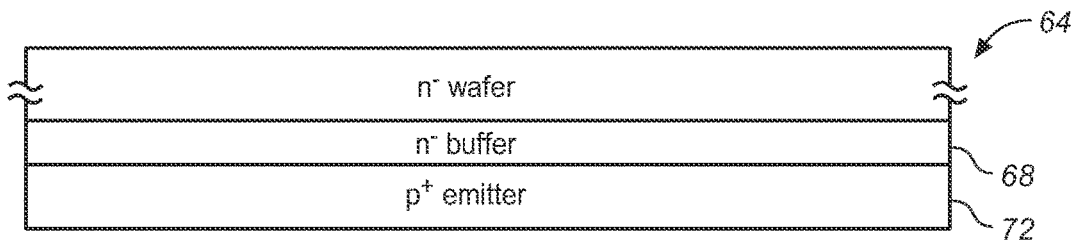
FIG. 8 illustrates energetic particles being injected into the bottom surface to damage the crystalline structure in either random distributed areas or in selected areas.

FIG. 8 illustrates energetic particles 76 being injected into the bottom surface of the wafer 64 to damage the crystalline structure in either random distributed areas or in selected areas. The damaged areas will have a higher etch rate than the undamaged areas. If there is no masking, the dose of the energetic particles 76 is fairly low so that the distribution is random and sparse, causing some areas to be damaged and other areas to not be damaged. A suitable dosage can be determined by simulation or by testing. Alternatively, a mask can be used to limit the damage to, for example, the edge area of the wafer 64 so as not to subsequently remove the p+ emitter layer 72 under the central cell array.

Suitable energetic particles include n-type dopant atoms such as phosphorus or arsenic; p-type dopant compounds such as $BF_2$; insert gas atoms such as helium, argon, or neon; semiconductor atoms such as silicon or germanium; or protons such as hydrogen ions that can cause voids and other defects.

Other ways of providing damaged crystalline silicon on the bottom surface include the following. Wafers with a high level of defects can be used. Or a high level of defects can be created using a process like intrinsic gettering. Or, damage to the back of the wafer can be caused with a laser in a patterned or a pseudo-random fashion before the silicon etch. Or, an etch resistant layer can be used that is itself masked and etched in a patterned or a pseudo-random fashion over the back of the silicon wafer before the silicon etch. Thus, the element 76 in FIG. 8 represents all of these processes.

Figure 9:
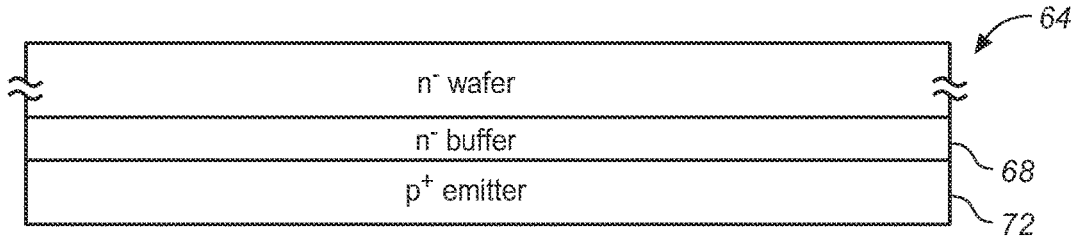
FIG. 9 illustrates wet etching the bottom surface of the wafer, where the etching rate is much more rapid in areas where the silicon is damaged.

FIG. 9 illustrates wet etching 78 the bottom surface of the wafer 64, where the etching rate is inherently much more rapid in areas where the silicon is damaged. Suitable wet etchants include KOH (potassium hydroxide) and TMAH (tetramethyl ammonium hydroxide). The wet etch time is sufficient to remove the silicon to the point where the n– buffer layer 68 is exposed in various areas. This time may be determined by simulation or testing. In another embodiment, other types of etching may be used where damaged silicon is etch more rapidly than crystalline silicon.

Figure 10:
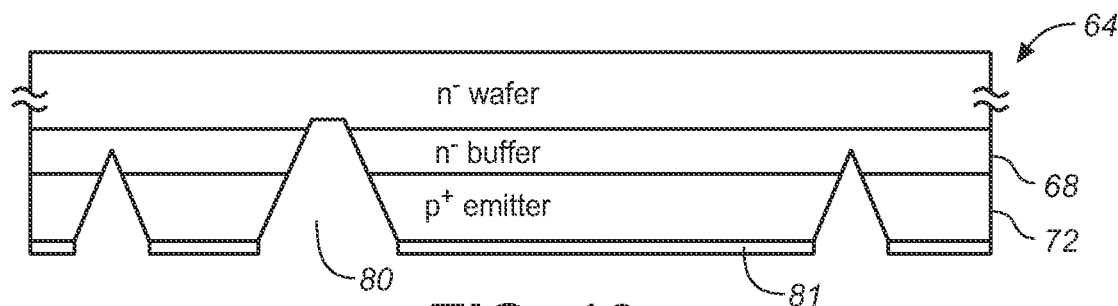
FIG. 10 illustrates the result of the wet etching, where the n– buffer layer is exposed in various areas. A patterned mask layer may be used, if desired, to only subject certain areas to the wet etch of FIG. 9. The mask may also be used to select areas that are subjected to the injection of energetic particles in FIG. 8, such as only in the termination region of the die.

FIG. 10 illustrates the result of the wet etching, where the n– buffer layer 68 is exposed in various areas. Since no masking is used, the damaged areas 80 are randomly distributed, with the more damaged areas having the highest etch rate. Another laser anneal may be performed to re-crystallize the damaged areas, if necessary, to achieve the lowest resistance of the layers.

FIG. 10 also illustrates the optional masking of the bottom surface (using mask 81) prior to the wet etching step of FIG. 9. This results in the selective etching of the silicon in only certain areas. The mask 81 may also be used to select areas that are subjected to the injection of energetic particles in FIG. 8, such as only in the termination region of the die. Accordingly, the areas to be rapidly etched by the wet etch or the areas that are subjected to the injection of energetic particles can be random (no mask) or predetermined using one or more masks.

Figure 11:
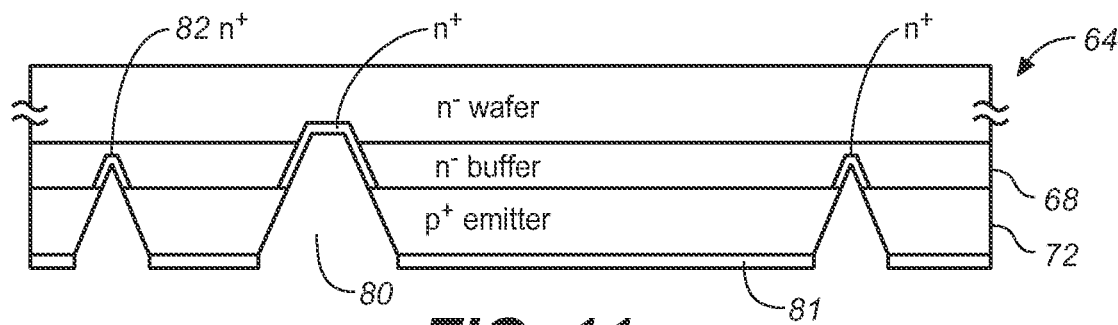
FIG. 11 illustrates the introduction of n-type dopants into the exposed etched regions to form n+ regions.

FIG. 11 illustrates the introduction of n-type dopants, such as arsenic or phosphorus, into the exposed etched regions to form n+ regions 82. This step may be used to form a subsequent low resistance ohmic contact to the exposed n-buffer region 68 (or to the exposed n-buffer and n– drift regions) so an anti-parallel diode with low resistance n-type and p-type contact regions may be formed. In embodiments where no masking is used, the bottom p+ emitter layer 72 should be heavily doped p-type so the net doping after the blanket introduction of n-type dopants is still p+.

Figure 1:
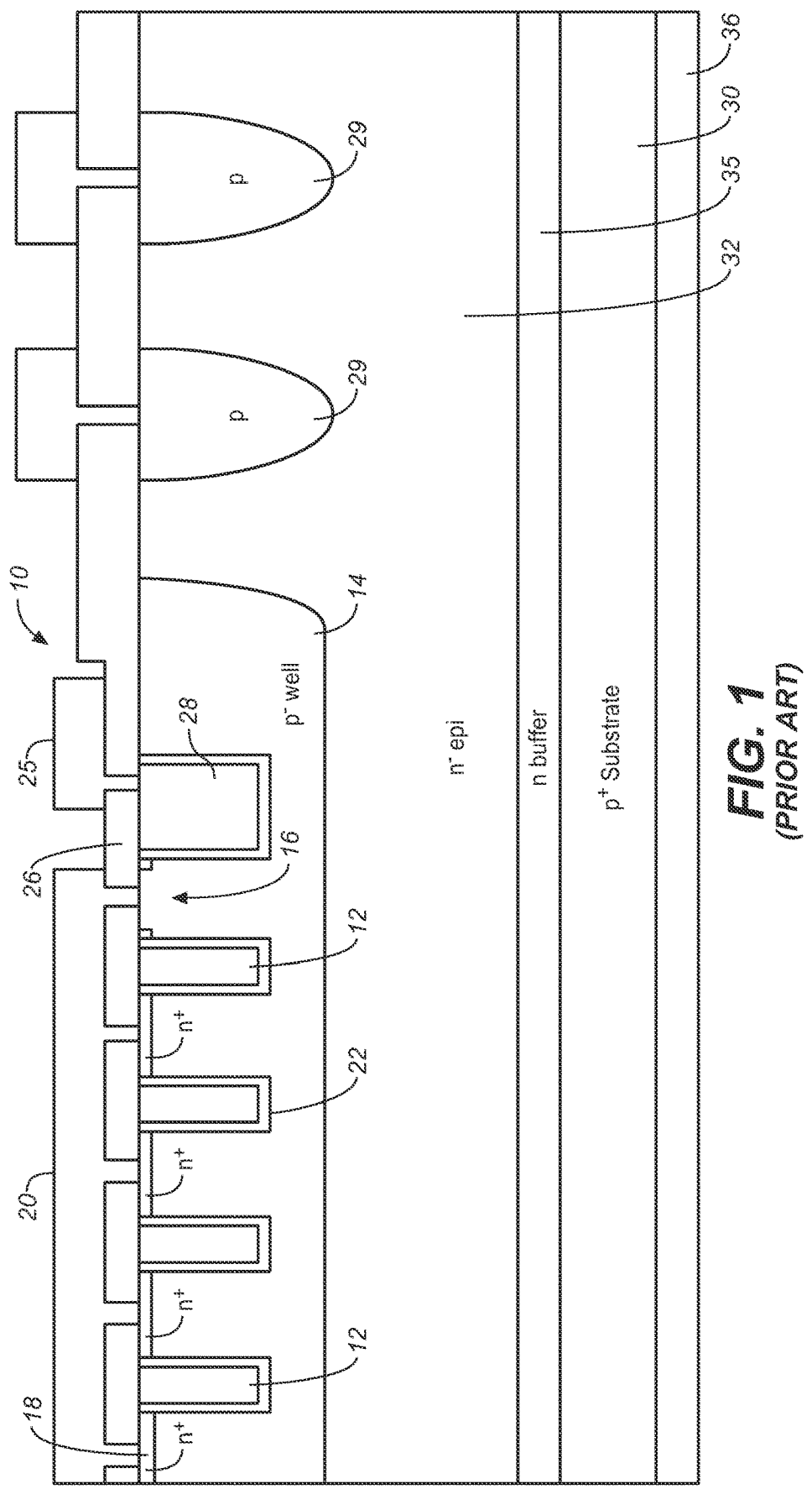
FIG. 1 is a cross-sectional view of a portion of a prior art IGTO device of the Applicant's own design, which does not contain an anti-parallel diode.
Figure 2:
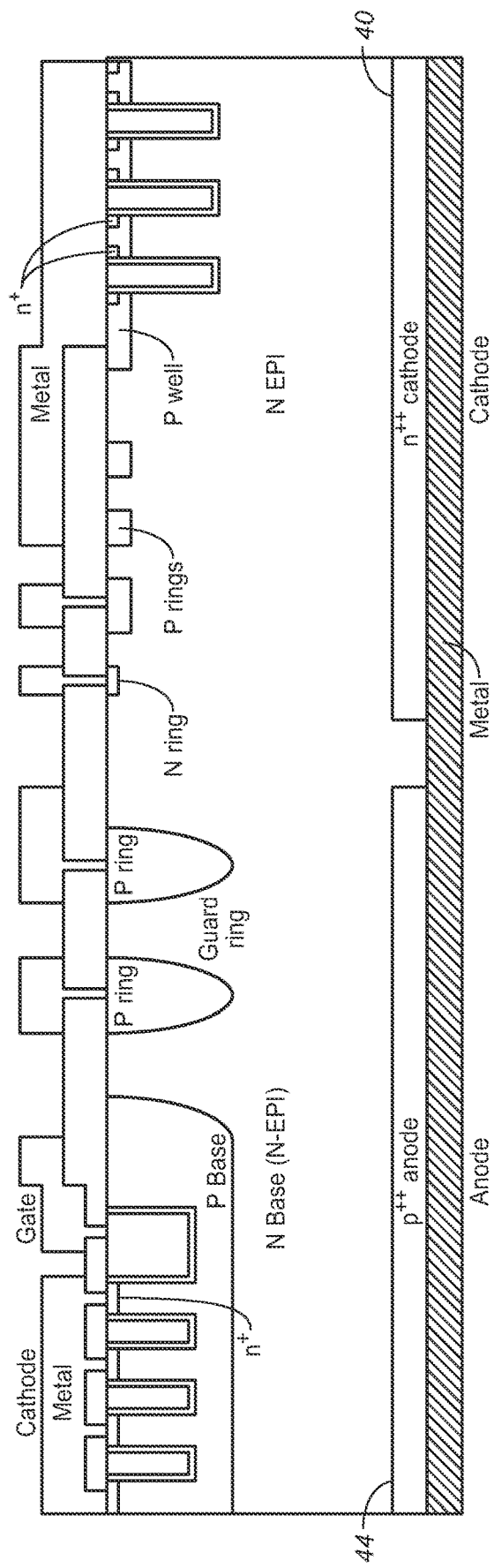
FIG. 2 is a cross-sectional view of a portion of a prior art IGTO device of the Applicant's own design where an integral anti-parallel diode is formed.
Figure 3:
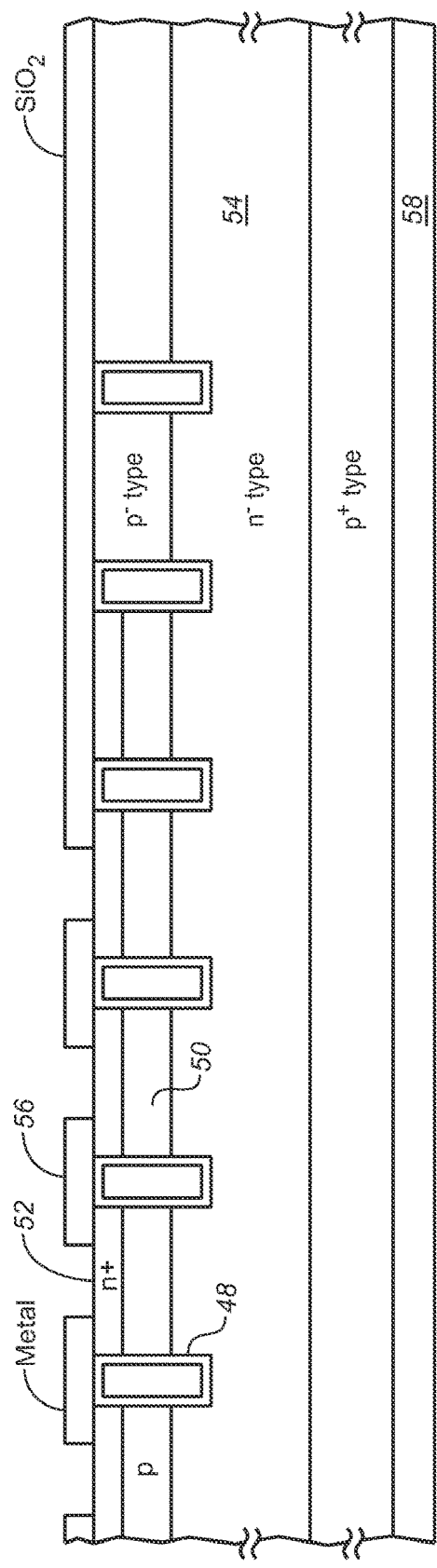
FIG. 3 is a cross-sectional view of a prior art IGBT which does not contain an anti-parallel diode.
Figure 12:
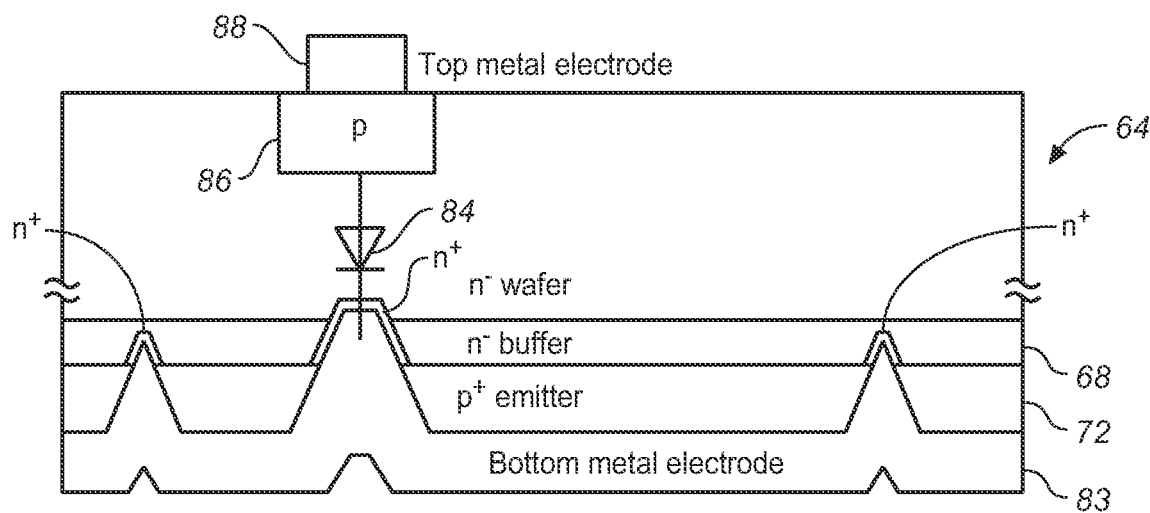
FIG. 12 illustrates the device after a bottom metallization, where the metal electrode directly contacts both the bottom p+ emitter layer and the n– buffer layer due to the uneven etching of the bottom surface. An anti-parallel diode symbol is overlaid in one area between the bottom metal electrode and any p-region formed in the top surface of the device.

FIG. 12 illustrates the device after a bottom metallization, where the metal electrode 83 directly contacts both the bottom p+ emitter layer 72 and the n– buffer layer 68 due to the uneven etching of the bottom surface. An anti-parallel diode symbol 84 is overlaid in one area between the bottom metal electrode 82 and any p-region 86 formed in the top surface of the device. The p-region 86 may include the p-well 14 in FIG. 1, or the p-well in the termination area of FIG. 2 coupled to a top metal electrode 88. The top metal electrode 88 will typically be the main cathode electrode that conducts current when the device is on. The anti-parallel diode conducts reverse voltage spikes that could otherwise damage the IGTO or IGBT device.

The device itself may be any vertical conduction device that conducts current in one direction when the device is on and can benefit from an anti-parallel diode that conducts in the opposite direction when the device is off and a reverse voltage is applied to the top and bottom electrodes of the device. Most vertical switches used for controlling motors or other inductive loads can benefit from the invention.

The thickness of the various layers depends on the desired device and operating parameters. Generally, a thinner p+ emitter layer 72 is beneficial for reduced forward voltage drop.

Figure 13:
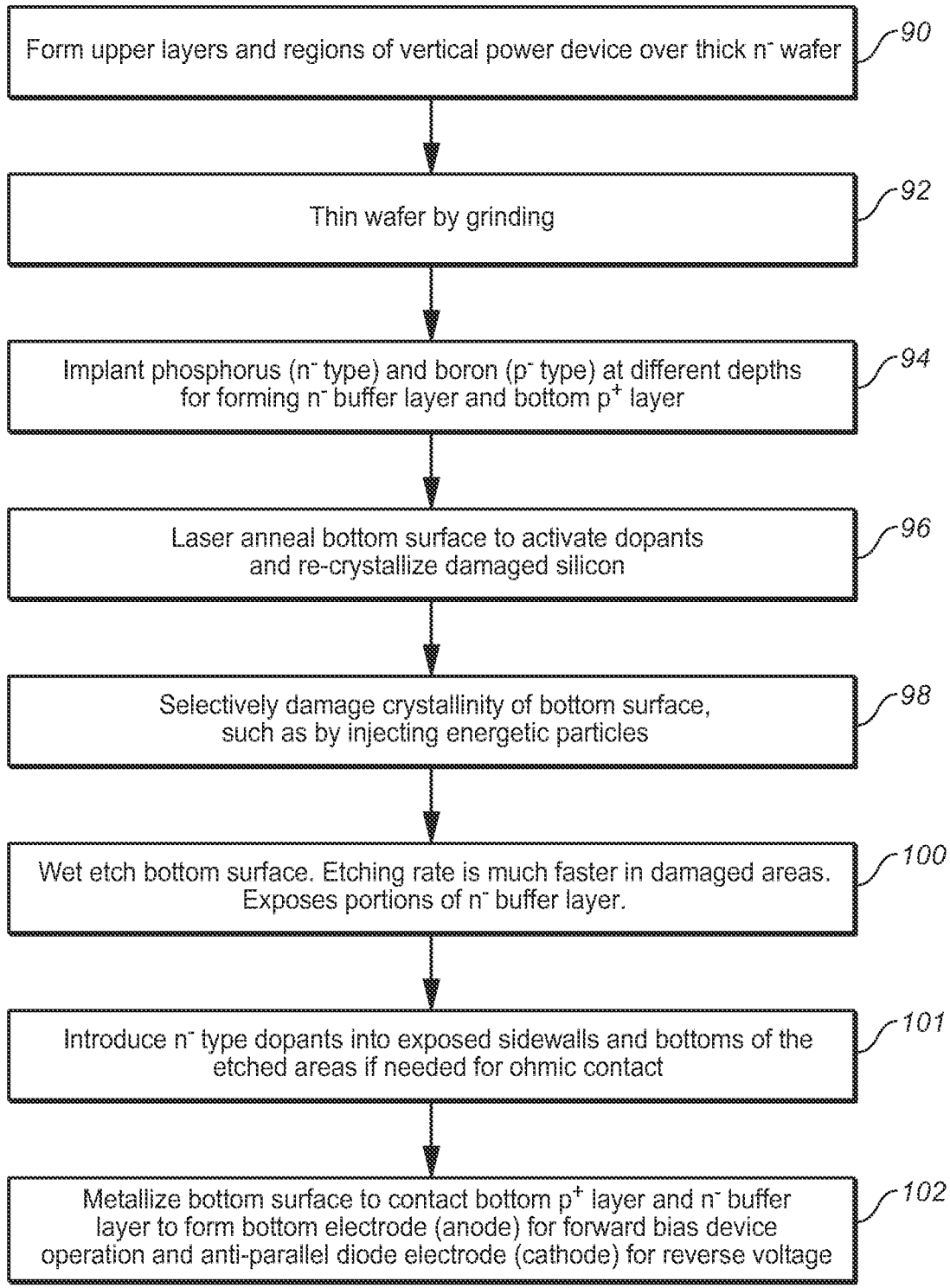
FIG. 13 is a flowchart of steps used in one embodiment of the invention where energetic particles are injected to damage the silicon.

FIG. 13 is a flowchart of steps used in one embodiment of the invention where a separate step is used to damage the silicon, such as injecting energetic particles. In step 90, all the "upper" device layers and regions are formed through the top surface of the wafer. Alternatively, a thick epitaxial layer can be formed over a starting wafer to form the n− drift region, and the other layers may be formed in the epitaxial layer. This allows the wafer to have any conductivity type and may be un-doped.

In step 92, the wafer is thinned, such as by grinding.

In step 94, n-type and p-type dopants are implanted in the back side of the thinned wafer to form the n− buffer layer and the bottom p+ emitter layer.

In step 96, the bottom surface is laser annealed to activate the dopants and re-crystallize the silicon.

In step 98, the bottom surface is randomly or selectively damaged by the injection of energetic particles, or using other techniques, to increase the etch rate in the damaged areas.

In step 100, the bottom surface of the wafer is wet etched. The etching rate is much higher in the damaged areas. The etching is stopped when areas of the n− buffer layer or the n− drift layer are exposed.

In step 101, n-type dopants are implanted into the sidewalls and bottom surfaces of the etched areas for ohmic contact to the bottom metal electrode.

In step 102, the bottom surface is metallized, resulting in the metal layer directly contacting the n− buffer layer and the p+ emitter layer. An anti-parallel diode is formed where the metal electrode directly contacts the n− buffer layer or n− drift region.

Figure 14:
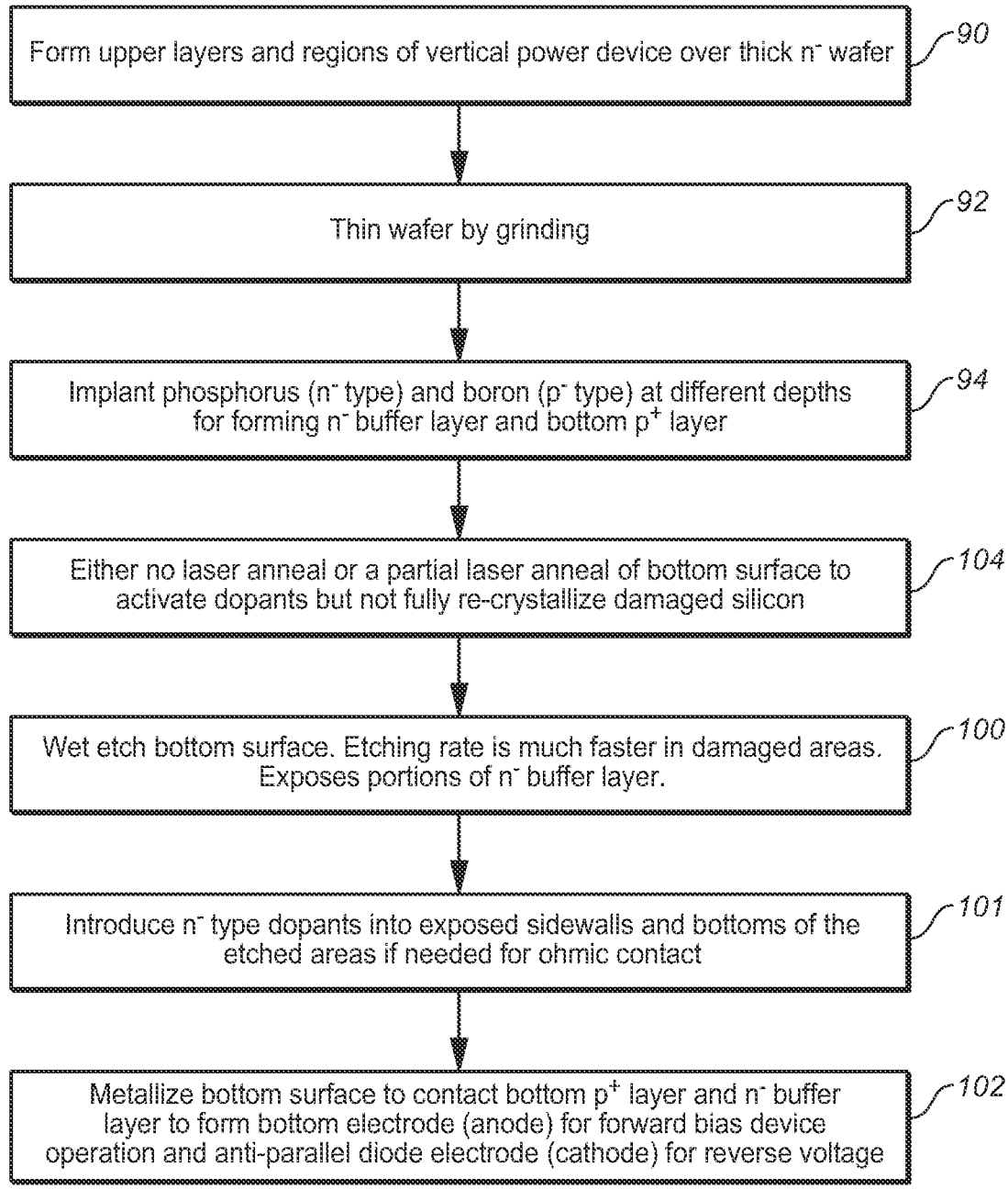
FIG. 14 is a flowchart of steps used in another embodiment of the invention where there is no step of injecting energetic particles, but rather the damage incurred by implanting n and p-type dopants is used to create uneven etch rates of the bottom surface.

FIG. 14 is a flowchart of steps used in another embodiment of the invention where there is no step of injecting energetic particles, but rather the damage incurred by implanting n and p-type dopants is used to create uneven etch rates of the bottom surface. In FIG. 14, all steps are the same as in FIG. 13, except that, in step 104, the laser anneal (if any) is insufficient to fully re-crystallize the silicon, resulting in some damaged areas of the bottom surface. Therefore, there is no need for the step 98 in FIG. 13 of injecting energetic particles to damage the silicon. After the wet etch step 100, an optional laser anneal step can be performed to re-crystallize the silicon to lower resistivity and lower the forward voltage.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a vertical power device comprising:
    providing a silicon substrate wafer having a top surface and a bottom surface;
    forming n-type and p-type device regions in the top surface of the wafer;
    thinning the wafer from the bottom surface;
    implanting dopants into the bottom surface such that the bottom surface is a first layer of a first conductivity type, wherein the first layer abuts a second layer, having a second conductivity type, overlying the first layer;
    causing the bottom surface of the wafer to have a damaged crystalline structure so that the silicon will etch unevenly in an etching process;
    etching the bottom surface, wherein areas of the bottom surface have non-uniform etch rates, until areas of the second layer are exposed; and
    forming a first metal electrode on the bottom surface such that the first metal electrode directly contacts the first layer and the second layer, wherein contact with the second layer forms an anti-parallel diode, and wherein the first metal electrode conducts current in a forward direction when the device is on, and the first metal electrode conducts a reverse current when the device is off and a reverse voltage is applied across the device.

2. The method of claim 1 wherein the step of etching the bottom surface comprises wet etching the bottom surface.

3. The method of claim 1 wherein causing the bottom surface of the wafer to have a damaged crystalline structure comprises injecting energetic atoms into the bottom surface.

4. The method of claim 1 wherein causing the bottom surface of the wafer to have a damaged crystalline structure comprises damaging the bottom surface with a laser.

5. The method of claim 1 wherein causing the bottom surface of the wafer to have a damaged crystalline structure comprises masking the bottom surface and then damaging an unmasked area of the bottom surface.

6. The method of claim 1 wherein causing the bottom surface of the wafer to have a damaged crystalline structure comprises performing a blanket process on the bottom surface without masking.

7. The method of claim 1 wherein causing the bottom surface of the wafer to have a damaged crystalline structure occurs during the step of implanting dopants into the bottom surface.

8. The method of claim 1 further comprising laser annealing the bottom surface after the step of implanting dopants into the bottom surface.

9. The method of claim 1 wherein the wafer includes a drift region overlying the second layer.

10. The method of claim 1 wherein the second layer is a buffer layer below a drift layer of the second conductivity type.

11. The method of claim 1 wherein the second layer comprises a drift layer.

12. The method of claim 1 wherein the step of etching the bottom surface comprises subjecting the bottom surface to a KOH solution or a TMAH solution.

13. The method of claim 1 wherein the step of forming n-type and p-type device regions in the top surface of the wafer comprises forming an insulated gate turn off device.

14. The method of claim 1 wherein the step of forming n-type and p-type device regions in the top surface of the wafer comprises forming an insulated gate bipolar transistor.

15. The method of claim 1 further comprising forming trenched gates through the top surface for controlling conductivity of the device.

16. The method of claim 1 wherein the anti-parallel diode is formed in selected areas across the wafer.

17. The method of claim 1 wherein the anti-parallel diode is formed in random areas across the wafer.

\* \* \* \* \*